United States Patent
Park et al.

(10) Patent No.: US 9,685,473 B2
(45) Date of Patent: Jun. 20, 2017

(54) 4-COLOR PIXEL IMAGE SENSOR HAVING VISIBLE COLOR NOISE REDUCTION FUNCTION IN NEAR INFRARED RAY PIXEL

(71) Applicant: SILICONFILE TECHNOLOGIES INC., Gyeonggi-do (KR)

(72) Inventors: Jae Young Park, Gyeonggi-do (KR); Won Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/135,219

(22) Filed: Apr. 21, 2016

(65) Prior Publication Data
US 2016/0315112 A1 Oct. 27, 2016

(30) Foreign Application Priority Data
Apr. 21, 2015 (KR) ........................ 10-2015-0055840

(51) Int. Cl.
| | |
|---|---|
| *H04N 9/64* | (2006.01) |
| *H04N 9/083* | (2006.01) |
| *H04N 3/14* | (2006.01) |
| *H04N 5/335* | (2011.01) |
| *H04N 9/04* | (2006.01) |

(Continued)

(52) U.S. Cl.
CPC .. *H01L 27/14623* (2013.01); *H01L 27/14607* (2013.01); *H01L 27/14621* (2013.01); *H01L 27/14636* (2013.01); *H01L 27/14645* (2013.01); *H01L 27/14649* (2013.01); *H04N 5/361* (2013.01); *H04N 5/3745* (2013.01); *H04N 9/045* (2013.01); *H01L 27/14627* (2013.01)

(58) Field of Classification Search
CPC .... H04N 5/2176; H04N 5/2178; H04N 5/361; H04N 5/3658; H04N 5/367; H01L 27/14623; H01L 27/14649; G01J 2001/444
See application file for complete search history.

(56) References Cited

U.S. PATENT DOCUMENTS

| | | | |
|---|---|---|---|
| 2008/0056707 A1* | 3/2008 | Ovsiannikov | G03B 13/02 396/375 |
| 2008/0106626 A1* | 5/2008 | Tatani | H01L 27/1462 348/308 |

(Continued)

*Primary Examiner* — Chia-Wei A Chen
(74) *Attorney, Agent, or Firm* — IP & T Group LLP

(57) ABSTRACT

A 4-color pixel image sensor having a visible color noise reduction function in a near infrared ray (NIR) pixel may include an active pixel region having a plurality of photodiodes, a plurality of first metal layers, a plurality of color filters, a first NIR pixel and a micro-lens, which are stacked, wherein the plurality of photodiodes are arranged in series and the plurality of color filters are formed to be adjacent to each other in series; an NIR optical black pixel region having a plurality of photodiodes and a second NIR pixel, which are stacked, wherein the plurality of photodiodes are arranged in series; and a visible optical black pixel region having a plurality of photodiodes, a second metal layer, a plurality of color filters and a micro-lens, which are stacked, wherein the plurality of photodiodes are arranged in series, and the plurality of color filters are formed to be adjacent to each other in series, wherein the active pixel region, the NIR optical black pixel region and the visible optical black pixel region are arranged on a same substrate in series.

17 Claims, 9 Drawing Sheets

(51) Int. Cl.
*H01L 27/146* (2006.01)
*H04N 5/361* (2011.01)
*H04N 5/3745* (2011.01)

(56) References Cited

U.S. PATENT DOCUMENTS

| | | | |
|---|---|---|---|
| 2009/0002531 A1* | 1/2009 | Godaiin | H01L 27/14621 348/294 |
| 2011/0205412 A1* | 8/2011 | Miyazaki | H01L 27/14621 348/294 |
| 2014/0168372 A1* | 6/2014 | Chang | H04N 13/0253 348/46 |
| 2016/0079293 A1* | 3/2016 | Ishii | H01L 27/14649 250/338.4 |
| 2016/0104735 A1* | 4/2016 | Li | G02B 5/201 257/432 |
| 2016/0255292 A1* | 9/2016 | Matsukura | G01J 1/42 |

* cited by examiner

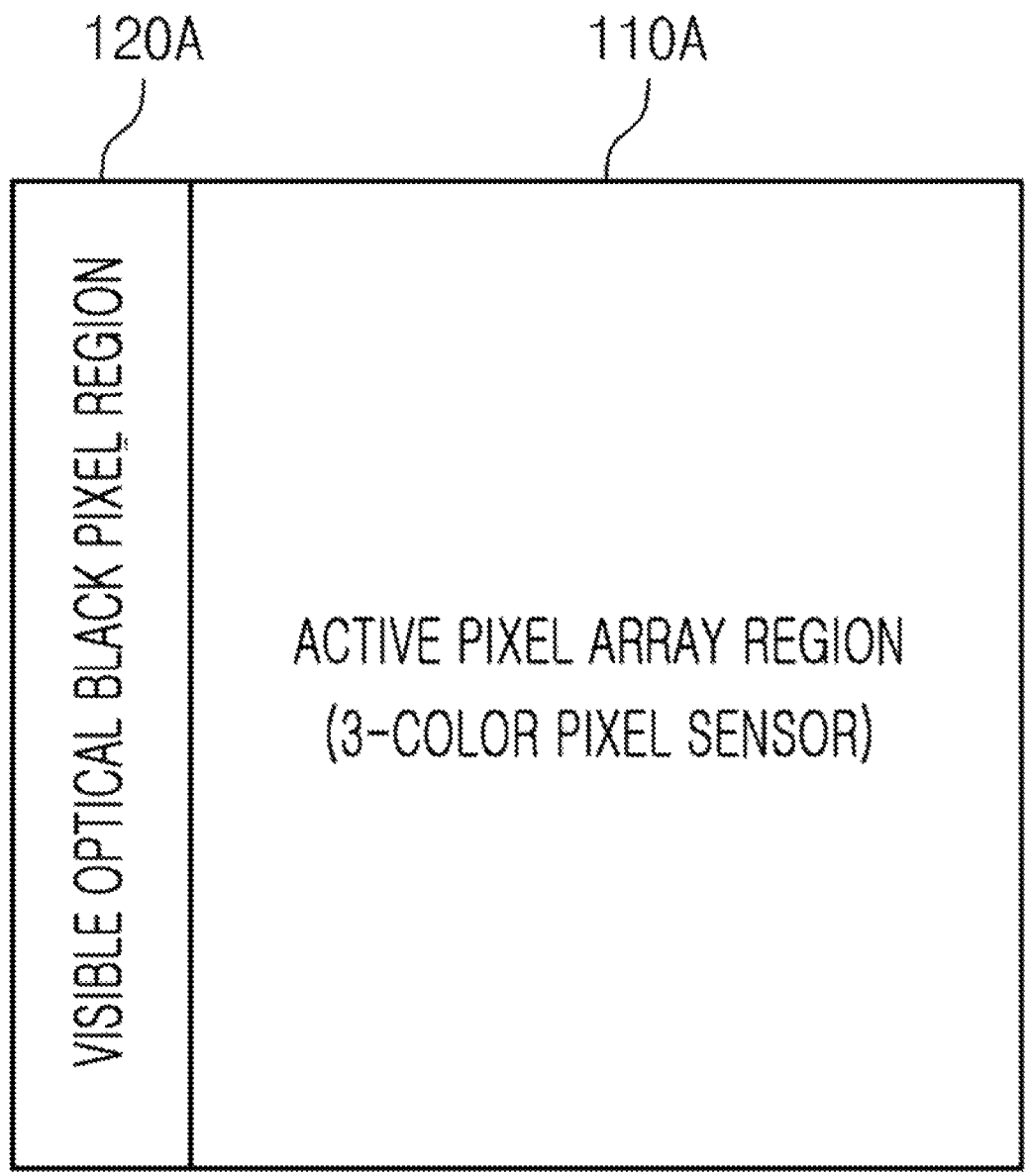

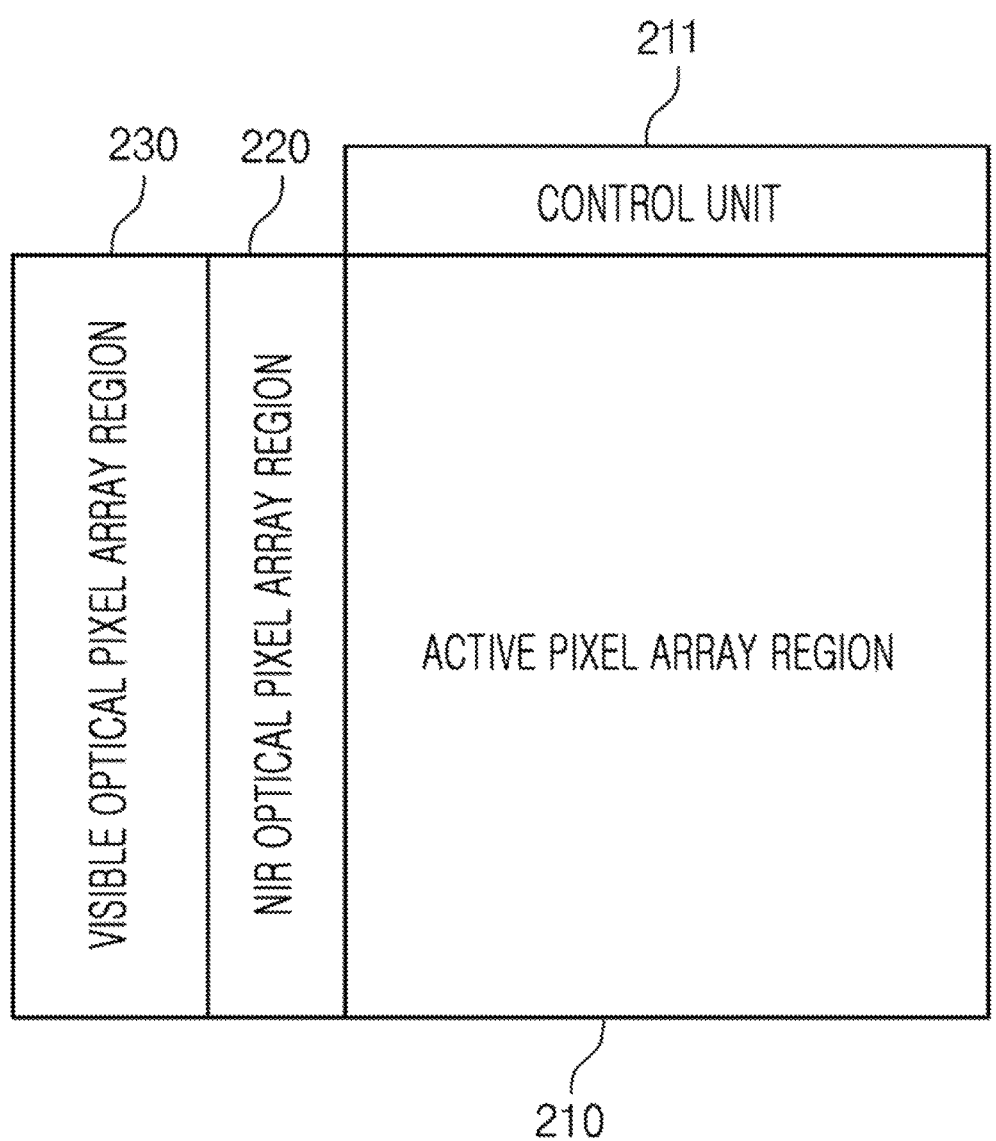

4-COLOR PIXEL IMAGE SENSOR HAVING VISIBLE COLOR NOISE REDUCTION FUNCTION IN NEAR INFRARED RAY PIXEL

CROSS-REFERENCE TO RELATED APPLICATIONS

The present application claims priority of Korean Patent Application No. 10-2015-0055840, and filed on Apr. 21, 2015, which is incorporated herein by reference in its entirety.

BACKGROUND

1. Field

Exemplary embodiments of the present invention relate to a visible color noise reduction technology in an image sensor, and more particularly, a 4-color pixel image sensor having visible color noise reduction function in a near infrared ray (IR) pixel that reduces a visible color noise in a visible region and a near IR (NIR) region of a 4-color pixel image sensor having a red pixel a green pixel, a blue pixel and an IR pixel.

2. Description of the Related Art

An image sensor is an element for converting an optical image into an electrical signal, and is widely used in a digital camera, a smart phone, an industrial equipment and a medical equipment.

As shown in FIG. 1A, a conventional 3-color pixel image sensor includes an active pixel array region 110A and a visible optical black pixel region 120A.

The active pixel array region 110A includes a plurality of unit pixels (active pixels) of a red color (R), a green color (G) and a blue color (B), which are arrayed in a matrix shape, and outputs a photoelectric converted image signal of 3-color. Each of the plurality of unit pixels includes a photoelectric conversion transistor, a charge detection element, a charge transfer transistor, a reset transistor and a selection transistor.

Since the visible optical black pixel region 120A is arranged to be adjacent to a side of the active pixel array region 110A and a pixel output is used as an offset value in a dark state, the visible optical black pixel region 120A is implemented in a state of the cut-off of an incident light. That is, the visible optical black pixel region 120A includes a black pixel which maintains a black level using a cutoff pixel and adjusts a pixel output by selectively being driven to compensate for the black level.

Like this the visible optical black pixel region 120A reduces a noise by determining an offset value of a corresponding active pixel using a plurality of unit pixels having a same structure as the active pixel included in the active pixel array region 110A and having a structure where the incident light is cutoff by a metal layer.

As shown in FIG. 1B, a conventional 4-color pixel image sensor includes an active pixel array region 110B and a visible optical black pixel region 120B.

The active pixel array region 110B includes a red pixel, a green pixel a blue pixel and an IR pixel, and outputs a photoelectric converted image signal of 4-color.

The visible optical black pixel region 120B outputs a constant reference signal irrespective of the incident light by having the plurality of unit pixels of structure where the incident light is cutoff by a light shielding layer in a region adjacent to the active pixel array region in order to prevent a level of an image signal from being changed according to a peripheral temperature variation.

Like this, the conventional 4-color pixel image sensor including only a visible optical black pixel region may conceal a color noise of a visible wavelength, but may not compensate for a noise (or cross talk) transferred from a RGB unit pixel to an NIR pixel and deteriorate a characteristic of the IR pixel.

SUMMARY

Exemplary embodiments of the present invention are directed to a 4-color pixel image sensor for compensating a visible color noise for an NIR signal and having an optimized near optical black pixel characteristic by adding an NIR optical black pixel region to a visible optical black pixel region in the 4-color pixel image sensor including a red pixel (R), a green pixel (G), a blue pixel (B) and an NIR pixel.

In accordance with an exemplary embodiment of the present invention, a 4-color pixel image sensor having a visible color noise reduction function in a near infrared ray (NIR) pixel may include an active pixel region having a plurality of photodiodes a plurality of first metal layers, a plurality of color filters, a first NIR pixel and a micro-lens, which are stacked, wherein the plurality of photodiodes are arranged in series and the plurality of color filters are formed to be adjacent to each other in series; an NIR optical black pixel region having a plurality of photodiodes and a second NIR pixel, which are stacked, wherein the plurality of photodiodes are arranged in series; and a visible optical black pixel region having a plurality of photodiodes, a second metal layer, a plurality of color filters and a micro-lens, which are stacked, wherein the plurality of photodiodes are arranged in series, and the plurality of color filters are formed to be adjacent to each other in series, wherein the active pixel region, the NIR optical black pixel region and the visible optical black pixel region are arranged on a same substrate in series.

The NIR optical black pixel region and the visible optical black pixel region may be arranged on a side among four sides of the active pixel array region in series irrespective of a sequence.

The first metal layer may be formed over the plurality of photodiodes.

The plurality of color filters may include a blue color filter, a green color filter and a red color filter.

The plurality of first metal layer and the second metal layer may be made of aluminum or copper.

The first NIR pixel and the second NIR pixel may absorb a light of a whole infrared ray (IR) wavelength band among an incident light.

The second metal layer may be formed over an entire upper surface of the photodiode.

The 4-color pixel image sensor may further include a control unit suitable for comparing a reference signal outputted from the NIR optical black pixel region to an IR pixel signal including a noise of an active pixel outputted from the active pixel array region, calculating a difference value between the reference signal and the IR pixel signal, and compensating to remove the noise, which is received in the first NIR pixel based on a calculated difference value.

The first NIR pixel and the second NIR pixel may be black photoresists.

The first NIR pixel and the second NIR pixel may have a structure where two color filters are stacked.

In accordance with another exemplary embodiment of the present invention, a 4-color pixel image sensor having a visible color noise reduction function in a near infrared ray (NIR) pixel may include an active pixel region having a plurality of photodiodes, a plurality of first tungsten layers, a plurality of color filters, a first NIR pixel and a micro-lens, which are stacked, wherein the plurality of photodiodes are arranged in series and the plurality of color filters are arranged in series; an NIR optical black pixel region having a plurality of photodiodes, a second tungsten layer and a second NIR which are stacked, wherein the plurality of photodiodes are arranged in series; and a visible optical black pixel region having a plurality of photodiodes, a third metal layer, a third tungsten layer, a plurality of color filters and a micro-lens, which are stacked, wherein the plurality of photodiodes are arranged in series, and the plurality of color filters are arranged in series, wherein the active pixel region, the NIR optical black pixel region and the visible optical black pixel region are arranged on a same substrate in series.

BRIEF DESCRIPTION OF THE DRAWINGS

FIG. 1A is a plane view illustrating a conventional 3-color pixel image sensor.

FIG. 2 is a plane view illustrating a 4-color pixel image sensor having a visible color noise reduction function in an NIR pixel in accordance with an embodiment of the present invention.

DETAILED DESCRIPTION

Figure 1B:
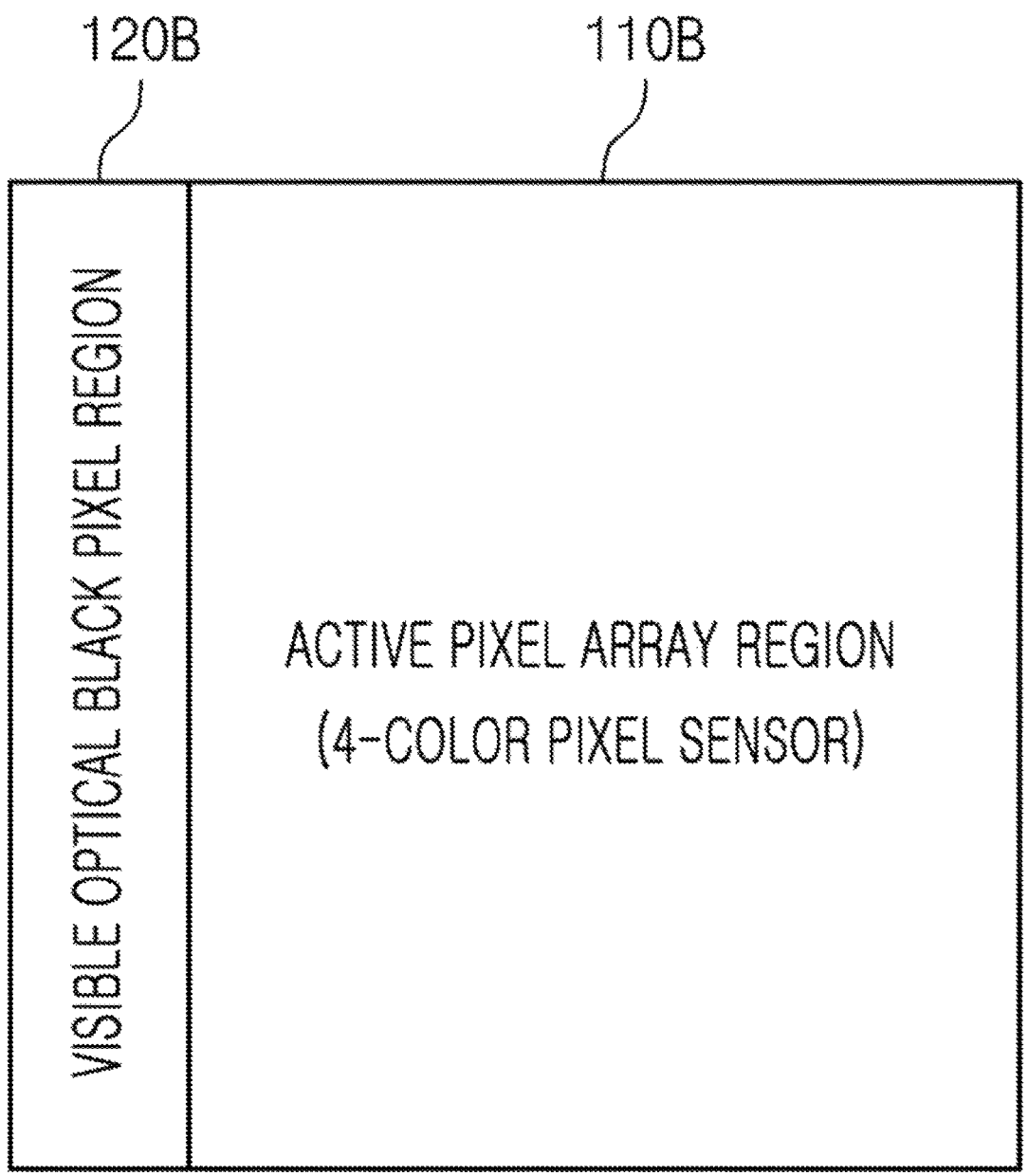
FIG. 1B is a plane view illustrating a conventional 4-color pixel image sensor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form as long as it is not specifically mentioned in a sentence. Furthermore 'include/comprise' or 'including/comprising' used in the specification represents that one or more components, steps, operations, and elements exists or are added.

FIG. 2 is a plane view illustrating a 4-color pixel image sensor having a visible color noise reduction function in an NIR pixel in accordance with an embodiment of the present invention.

As shown in FIG. 2, the 4-color pixel image sensor includes an active pixel array region 210, an NIR optical black pixel region 220 and a visible optical black pixel region 230, which are arranged to be adjacent to each other in series on a same plane (substrate). A control unit 211 is disposed on a side of the active pixel array region 210.

Although the NIR optical black pixel region 2220 and the visible optical black pixel region 230 are sequentially formed to be adjacent to a side, e.g., a left side, of the active pixel array 210 as shown in FIG. 2, the present invention is not restricted in this, the NIR optical black pixel region 2220 and the visible optical black pixel region 230 may be sequentially formed to be adjacent to a predetermined side among four sides of the active pixel array 210

Figure 3:
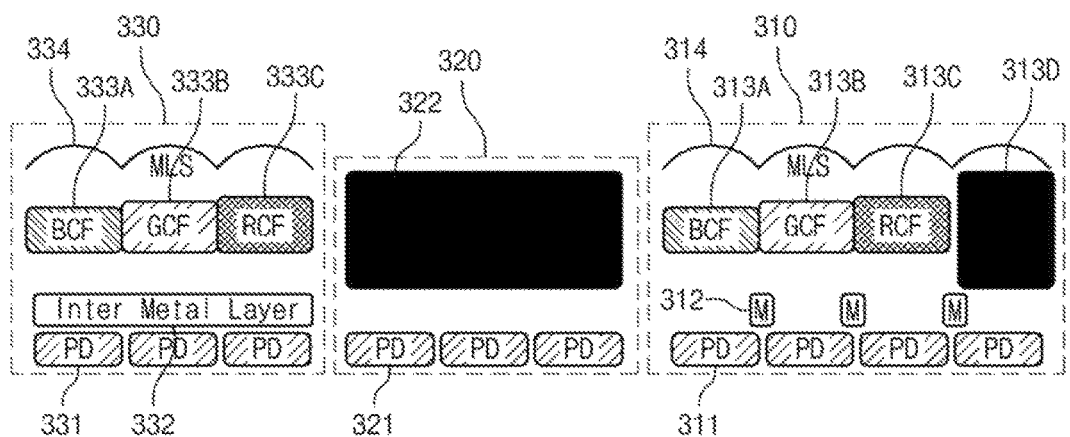
FIG. 3 is a cross sectional view illustrating a 4-color pixel image sensor having a visible color noise reduction function in an NIR pixel in accordance with a first embodiment of the present invention.

FIG. 3 is a cross sectional view illustrating a 4-color pixel image sensor having a visible color noise reduction function in an NIR pixel in accordance with a first embodiment of the present invention, which is applied to a front side illumination type complementary metal-oxide-semiconductor (CMOS) image sensor.

As shown in FIG. 3, the 4-color pixel image sensor includes an active pixel array region 310, an NIR optical black pixel region 320 and a visible optical black pixel region 330, which are formed to be adjacent to each other in series on a same plane (e.g., a substrate).

The active pixel array region 310 includes a plurality of photodiodes 311, a first metal layer 312, a blue color filter 313A, a green color filter 313B, a red color filter 313C, a first NIR pixel 313D and a micro-lens 314. The plurality of photodiodes 311 are formed to have a predetermined interval in series. The first metal layer 312 is formed over a space between the plurality of photodiodes 311. The blue color filter 313A, the green color filter 313B, the red color filter 313C and the first NIR pixel 313D are formed over the first metal layer 312 to be adjacent to each other in series. The micro-lens is formed over an entire upper surface of the blue color filter 313A, the green color filter 313B, the red color filter 313C and the first NIR pixel 313D. Herein, the first NIR pixel 313D is exemplarily embodied as a black photoresist.

Thus, the active pixel array region 310 outputs a photoelectric converted image signal of 4-color using a plurality of unit pixels of R, G and B, which are arranged in a matrix shape. Herein, the first NIR pixel 313D absorbs the light of IR wavelength band among the light, which passes through the micro-lens 314, and cut-offs a visible wavelength band e.g., about 400 nm to 600 nm. Each of the plurality of unit pixels a photoelectric conversion transistor, a photodiode 311 for detecting a charge, a charge transfer transistor, a reset transistor and a selection transistor.

The NIR optical black pixel region 320 includes a plurality of photodiodes 321, which are formed to have a predetermined interval in serials, and a second NIR pixel 322 formed on an entire upper surface of the plurality of photodiodes 321. Herein, the second NIR pixel 322 is exemplarily embodied as a black photoresist.

Like this, the photodiodes 321 of the NIR optical black pixel region 320 has a same structure as the photodiodes 311 of the active pixel array region 310, but generates a whole IR signal from the photodiodes 321 by removing the metal layer as unlike the active pixel array region 310. Thus, the NIR optical black pixel region 320 absorbs the light of the whole IR wavelength band through the photodiodes 321, cut-offs a visible wavelength band, e.g., about 400 nm to 650 nm, and outputs a reference signal based on the absorbed light.

Therefore, the control unit 221 may compensate a 3-color noise of the NIR pixel. That is, the control unit 221 compares the reference signal outputted from the NIR optical black pixel region 320 to the IR pixel signal including the noise of the active pixel outputted from the active pixel array region 310, calculates a difference value between the reference signal and the IR pixel signal including the noise of the active pixel, and compensates to remove the noise, which is received in the first NIR pixel 313D based on the calculated difference value. Thus, the IR signal characteristic of the active pixel array region 310 is improved by removing the noise (or cross-talk), which is transferred from the R, G and B unit pixels of the active pixel array region 310 to the first NIR pixel 313D.

The visible optical black pixel region 330 includes a plurality of photodiodes 331, a second metal layer 332, a blue color filter 333A, a green color filter 333B, a red color filter 333C, a second NIR pixel 333D and a micro-lens 334. The plurality of photodiodes 331 are formed to have a predetermined interval in series. The second metal layer 332 is formed over an entire upper surface of the plurality of photodiodes 331. The blue color filter 333A, the green color filter 333B, the red color filter 333C and the second NIR pixel 313D are formed to be adjacent to each other in series over the second metal layer 312. The micro-lens is formed on an entire upper surface of the blue color filter 333A, the green color filter 333B, the red color filter 333C and the second NIR pixel 333D. The material of the second metal layer 332 is not restricted in a specific material, and may include aluminum (Al) or copper (Cu).

Thus, the light of the visible light wavelength band and the IR wavelength band is cutoff by the second metal layer 332 in the visible optical black pixel region 330. Thus, the visible optical black pixel region 330 detects a dark signal through the plurality of photodiodes 331 and outputs a reference signal based on the detected dark signal. The control unit 221 compensates the dark signal of the active pixel array region 310 using the reference signal outputted from the visible optical black pixel region 330.

In conclusion, the imager sensor in accordance with the first embodiment of the present invention may reduce a color noise on the R, G and B pixels of the visible region using the visible optical black pixel region 330, and may prevent the IR signal characteristic of the NIR pixel from being deteriorated using the NIR optical black pixel region 320.

Figure 4:
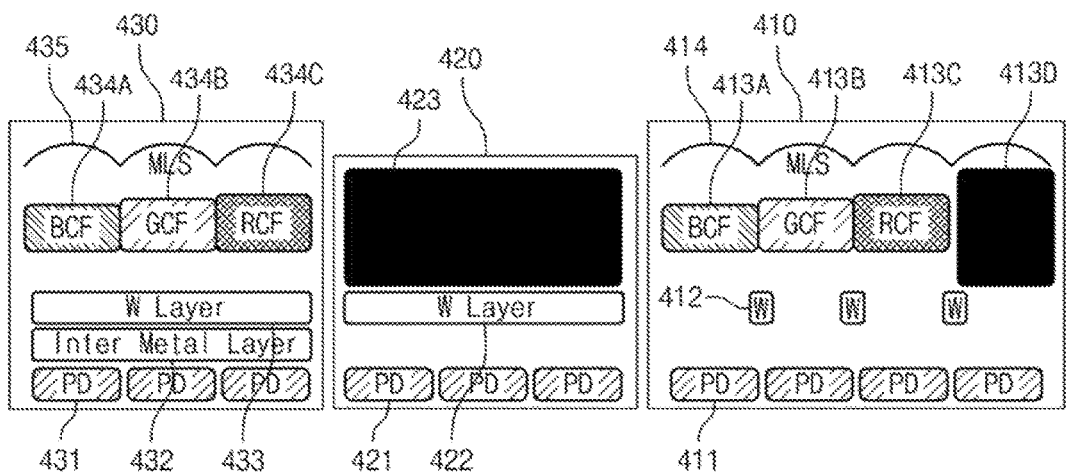
FIG. 4 is a cross sectional view illustrating a 4-color pixel image sensor having a visible color noise reduction function in an NIR pixel in accordance with a second embodiment of the present invention.

Meanwhile, FIG. 4 is a cross sectional view illustrating a 4-color pixel image sensor having a visible color noise reduction function in an NIR pixel in accordance with a second embodiment of the present invention.

Referring to FIG. 4, the 4-color pixel image sensor includes an active pixel array region 410, an NIR optical black pixel region 420 and a visible optical black pixel region 430.

The active pixel array region 410 are formed to be adjacent to each other at a predetermined interval in series, and includes a plurality of photodiodes 412, a tungsten layer 412, a blue color filter 413A, a green color filter 413B, a red color filter 413C, a first NIR pixel 413D and a micro-lens 414. The plurality of photodiodes 412 are formed to have an interval in series. The first tungsten layer 412 is formed over of the photodiodes. The blue color filter 413A, the green color filter 4136, the red color filter 413C and the first NIR pixel 413D are formed over an entire upper surface of the plurality of photodiodes and the first tungsten layer 412 to be adjacent to each other in series. The micro-lens is formed over the entire upper surface of the green color filter 4136, the red color filter 413C, and the first NIR pixel 413D. Herein, the first NIR pixel 413D may be exemplarily implemented as a black photoresist.

When the active pixel array region 410 compared to the active pixel array region 310 shown in FIG. 3, the first metal layer is removed from the active pixel array region 310 shown in FIG. 3, and the plurality of first tungsten layers 412 are formed instead of the first metal layer shown in FIG. 3. The firs tungsten layer 412 is used as a supplementary element to cut off the visible wavelength band. Thus, the cross-talk between the plurality of unit pixels may be prevented in the active pixel array region 410.

Although the micro-lens 414 is exemplarily formed over the first NIR pixel 413D in FIG. 4, the present invention is not restricted by this embodiment, but the micro-lens 414 may be selectively formed. Since the micro-lens 414 concentrates the light of the visible wavelength band, if the micro-lens 414 corresponding to the first NIR pixel 413 is omitted, the noise element of the visible region is reduced.

The NIR optical black pixel region 420 includes a plurality of photodiodes 421, a second tungsten layer 422 and a second NIR pixel 423. The plurality of photodiodes 421 are formed have a predetermined interval in series. The second tungsten layer 422 is formed over the photodiodes 421. The second NIR pixel 423 is formed over an entire upper surface of the second tungsten layer 422. Herein the second NIR pixel 423 may be exemplarily implemented as the black photoresist.

Thus, the NIR optical black pixel region 420 absorbs the light of the whole IR wavelength band and outputs a reference signal based on the absorbed light. When the NIR optical black pixel region 420 is compared to the NIR optical black pixel region 320 shown in FIG. 3, the second tungsten layer 422 is formed over an entire upper surface of the plurality of pixels. Thus, the second tungsten layer 422 is used as a supplementary element for cutting off the light of the visible wavelength band. Thus, the cross-talk between the plurality of unit pixels may be prevented in the NIR optical black pixel region 420.

The visible optical black pixel region 430 includes a plurality of photodiodes 431, a third metal layer 432, a third tungsten layer 433, a blue color filter 434A, a green color filter 434B, a red color filter 434C and a micro-lens 435. The plurality of photodiodes 431 are formed to have an interval in series. The third metal layer 432 is formed over the plurality of photodiodes 431. The third tungsten layer 433 is formed over an entire upper surface of the third metal layer 432. The blue color filter 434A, the green color filter 434B and the red color filter 434C are formed to be adjacent to each other in series over an entire upper surface of the third tungsten layer 433. The micro-lens 435 is formed over an entire upper surface of the blue color filter 434A, the green color filter 434B and the red color filter 434C.

Thus, the light of the visible wavelength band and the IR wavelength band are cut-off by the third metal layer 432 in the visible optical black pixel region 430. The visible optical black pixel region 430 may detect a dark signal through the plurality of photodiodes 431 and output a reference signal based on a detected dark signal. When the visible optical black pixel region 430 is compared to the visible optical black pixel region 330 shown in FIG. 3, the third tungsten layer 433 is formed over the entire upper surface of the plurality of pixels. Thus, the cross-talk between the plurality of unit pixels may be prevented in the visible optical black pixel region 430.

Although the thickness of the first tungsten layer 413, the second tungsten layer 422 and the third tungsten layer 433 is not restricted, if the thickness of the first tungsten layer 413, the second tungsten layer 422 and the third tungsten layer 433 is over than 1 KÅ, an image sensor may be not used because an optical efficiency is much lower. As an experimental result, it is preferable that the thickness of the first tungsten layer 413, the second tungsten layer 422 and the third tungsten layer 433 is about 500 Å.

Figure 5A:
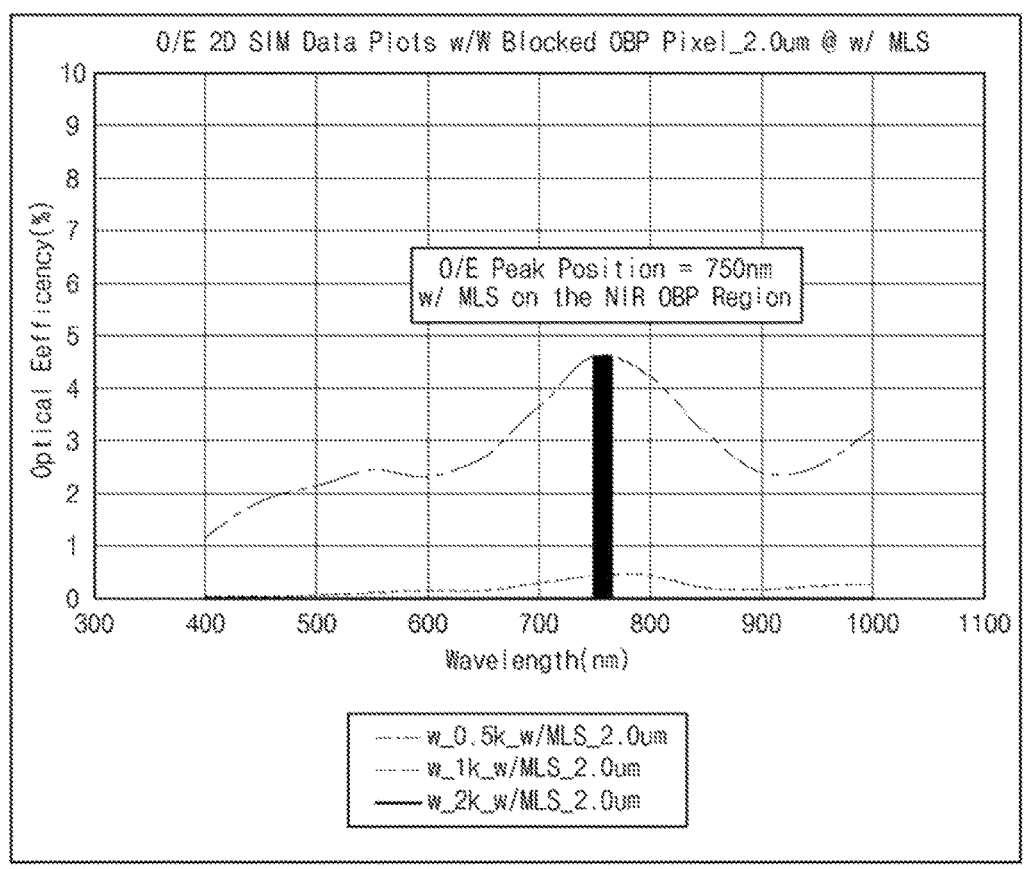
FIGS. 5A and 5B are graphs illustrating a simulation result of an optical efficiency of an NIR wavelength according to a micro-lens in an NIR optical black pixel region of a conventional 4-color pixel image sensor.
Figure 5B:
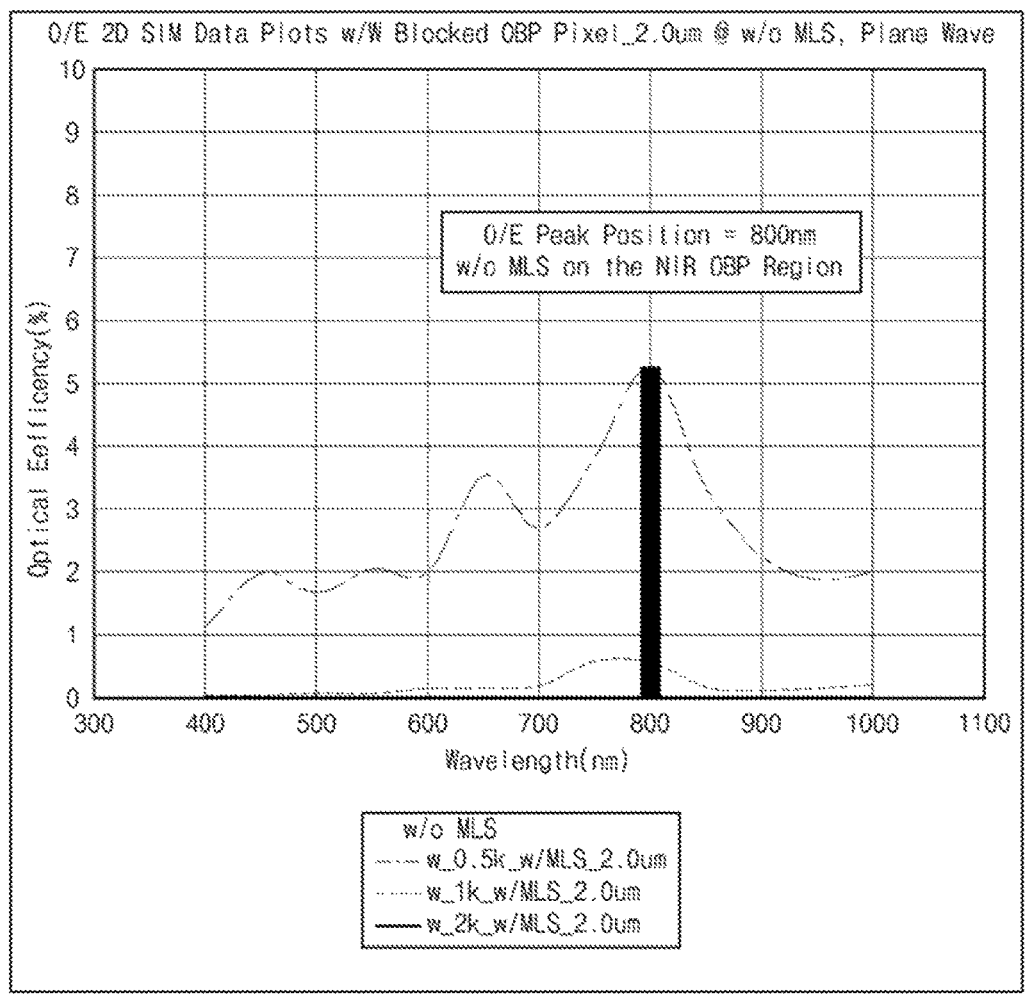

If the image sensor is implemented as shown in FIG. 4, an optical efficiency (OE) of the NIR wavelength band in the NIR optical black pixel region 420 is represented as a maximum value as shown in FIGS. 5A and 5B. Thus, the 4-color image sensor in accordance with the second embodiment of the present invention may be usefully applied to a product group using a specific wavelength band (e.g., about 800 nm).

FIG. 5A represents an optical efficiency value of an NIR wavelength in case that the NIR optical black pixel region 420 includes the tungsten layer 422 and the micro-lens, and FIG. 5B represents an optical efficiency value of the NIR wavelength in case that the NIR optical black pixel region 420 includes the tungsten layer 422 except for the micro-lens. As shown in FIGS. 5A and 5B, if the micro-lens is not included in the NIR optical black pixel region 420, the optical efficiency value is higher than the other, the optical efficiency value of 800 nm wavelength band is a peak value, and the optical efficiency value is greatly changed on a basis of the peak value. In the second embodiment of the present invention, the NIR optical black pixel region 420 that does not include micro-lens is implemented according to the above-described characteristics.

Although the optical efficiency is lowered since the tungsten layer 422 is used in the NIR optical black pixel region 420, the compensation may be performed by raising a gain value in a setting process of the image sensor.

Figure 6:
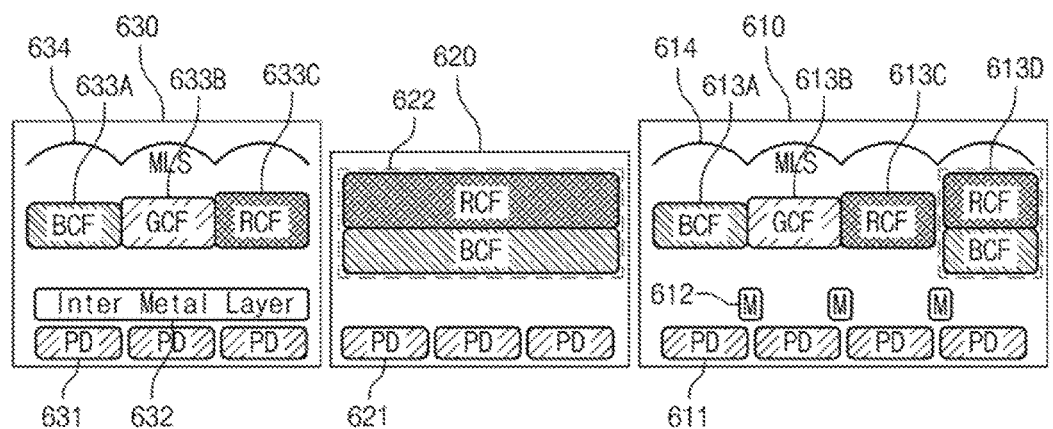
FIG. 6 is a cross sectional view illustrating a 4-color pixel image sensor having a visible color noise reduction function in an NIR pixel in accordance with a third embodiment of the present invention.

FIG. 6 is a cross sectional view illustrating a 4-color pixel image sensor having a visible color noise reduction function in an NIR pixel in accordance with a third embodiment of the present invention applied to a front side illumination type CMOS image sensor. As compared to the first embodiment of the present invention shown in FIG. 3, the first NIR pixel 313D and the second NIR pixel 322 of the black photoresist are implemented as a first stacked color filter 613D and a second stacked color filter 622 having a structure where the blue color filter and the red color filter are stacked.

Figure 8:
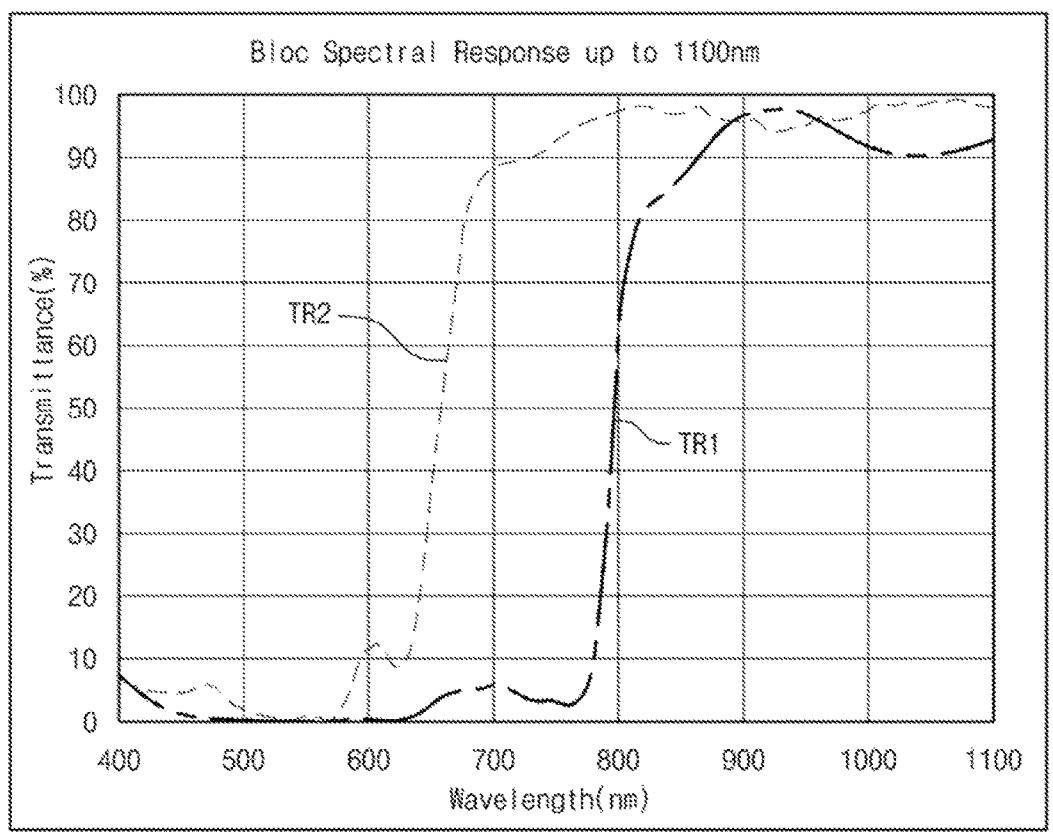
FIG. 8 is a graph illustrating a penetration ratio of an NIR color filter and a stacked color filter applied to embodiments of the present invention.

Thus, an operation of the 4-color pixel image sensor shown in FIG. 6 is same as an operation of the 4-color pixel image sensor shown in FIG. 3. However, the first stacked color filter 613D and the second stacked color filter 622 receives a wavelength band of 770 nm such as a graph TR1 shown in FIG. 8, and the first NIR pixel 313D and the second NIR pixel 322 receives a wavelength band of 650 nm such as a graph TR2 shown in FIG. 8. In contrary, in case of the optical efficiency (OE) or the sensitivity of the IR wavelength band, the first NIR pixel 313D and the second NIR pixel 322 are greater than the first stacked color filter 613D and the second stacked color filter 622.

A combination of an IR cut filter or a dual band pass filter may be used as another example of the NIR pixel.

Figure 9:
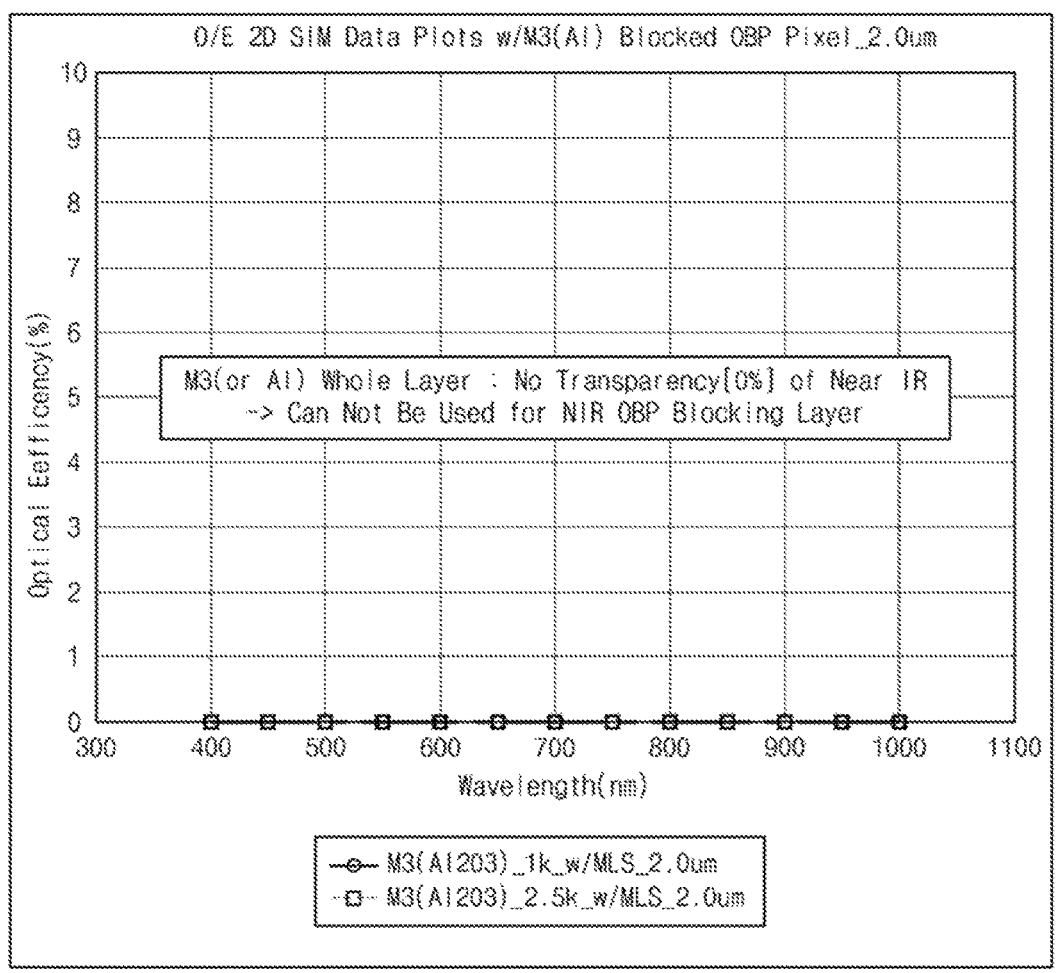
FIG. 9 is a graph illustrating an experiment result of an optical efficiency according to a thickness of a metal layer in an NIR wavelength band.

Also, in the NIR wavelength band, the optical efficiency according to the thickness of the metal layer 612 and 632 using aluminum (Al) is 0% as shown in FIG. 9.

Figure 7:
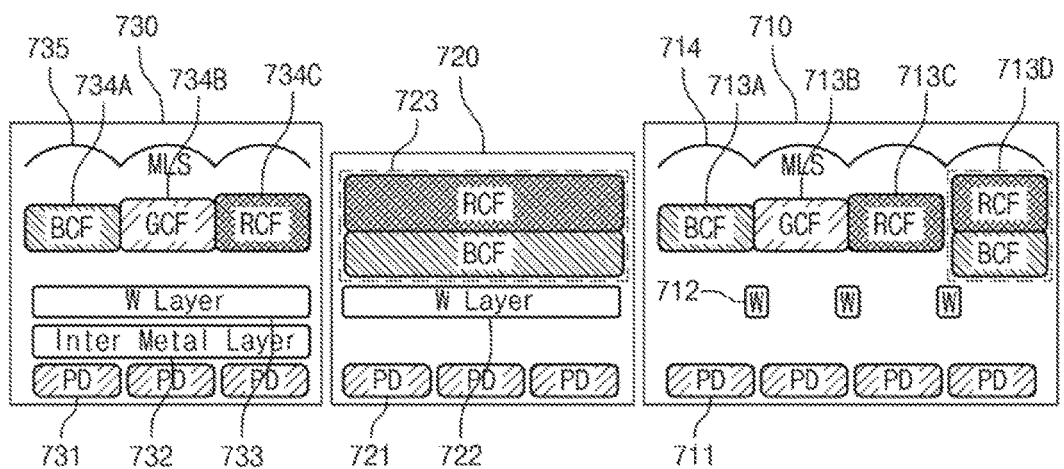
FIG. 7 is a cross sectional view illustrating a 4-color pixel image sensor having a visible color noise reduction function in an NIR pixel in accordance with a fourth embodiment of the present invention.

FIG. 7 is a cross sectional view illustrating a 4-color pixel image sensor having a visible color noise reduction function in an NIR pixel in accordance with a fourth embodiment of the present invention. As compared to the second embodiment of then present invention shown in FIG. 4, the first NIR pixel 413D and the second NIR pixel 423 of the black photoresist are implemented as a first stacked color filter 713D and a second stacked color filter 723 having a structure where the blue color filter and the red color filter are stacked.

Thus, an operation of the 4-color pixel image sensor shown in FIG. 7 is same as an operation of the 4-color pixel image sensor shown in FIG. 4. However, the transmittance of the first tacked color filter 713D and the second stacked color filter 723 is formed at 770 nm such as a graph TR1 shown in FIG. 8, and the transmittance of the first NIR pixel 413D and the second NIR pixel 423 is formed at 650 nm such as a graph TR2 shown in FIG. 8.

In the NIR wavelength band, the optical efficiency according to the thickness of the third metal layer 732 using aluminum (Al) is 0% as shown in FIG. 9.

A table 1 represents an application state of main items (or layer) in each region of the 4-color pixel image sensor having a visible color noise reduction function in NIR pixel in accordance with embodiments of the present invention. Herein, the tungsten layer may be a selective option. The tungsten of the NIR optical black pixel region cuts off more clearly the wavelength band of the visible region. Herein, "BCF+RCF" denotes a stacked color filter where a blue color filter and a red color filter are stacked "Black+PR" denotes an NIR pixel of a black photoresist, and "^" denotes a function for cutting off a wavelength band under 800 nm wavelength band.

TABLE 1

| Items | Active Pixel [AP] | Visible OBP | NIR OBP [BCF + RCF] | NIR OBP [Black + PR] |
|---|---|---|---|---|
| MLS | ○ | ○ | X | X |
| CFA | ○ | ○ | RCF/BCF Double Layer^ | Black_PR Layer^ |
| W grid^ | Lattice Pattern (Option) | Whole layer (Option) | Whole Layer (Option) | Whole Layer (Option) |
| Photo Diode | ○ | ○ | ○ | ○ |
| Main Purpose | Main Image Capture & Preview/ Movie Mode | Black level Cancellation for Visible Output signal | Black level Cancellation for Visible Output signal | Black level Cancellation for Visible Output signal |

In the embodiments of the present invention, the NIR optical black pixel region is formed to be adjacent to a side of the active pixel array region, and the visible optical black pixel region is formed to be adjacent to the other side of the visible optical black pixel region. However, the present invention is not restricted in this embodiments.

For example, a visible optical black pixel region may be formed to be adjacent to a side of an active pixel array region, and an NIR optical black pixel region may be formed to be adjacent the other side of the visible optical black pixel region.

The 4-color pixel image sensor including R, G, B and IR pixels in accordance with embodiments of the present invention may compensate a visible color noise on an NIR signal by adding an NIR optical black pixel region to a visible optical black pixel region, and may improve an IR signal characteristic by using an optimized NIR optical black pixel characteristic through a simulation.

While the present invention has been described with respect to the specific embodiments, it will be apparent to those skilled in the art that various changes and modifications may be made without departing from the spirit and scope of the invention as defined in the following claims.

What is claimed is:

1. A 4-color pixel image sensor having a visible color noise reduction function in a near infrared ray (NIR) pixel, comprising:
    an active pixel region having a plurality of photodiodes, a plurality of first metal layers, a plurality of color filters, a first NIR pixel and a micro-lens, which are stacked, wherein the plurality of photodiodes are arranged in series and the plurality of color filters are formed to be adjacent to each other in series;
    an NIR optical black pixel region having a plurality of photodiodes and a second NIR pixel, which are stacked, wherein the plurality of photodiodes are arranged in series; and
    a visible optical black pixel region having a plurality of photodiodes, a second metal layer, a plurality of color filters and a micro-lens, which are stacked, wherein the plurality of photodiodes are arranged in series, and the plurality of color filters are formed to be adjacent to each other in series,
    wherein the active pixel region, the NIR, optical black pixel region and the visible optical black pixel region are arranged on a same substrate in series.

2. The 4-color pixel image sensor of claim 1, wherein the NIR optical black pixel region and the visible optical black pixel region are arranged on a side among four sides of the active pixel array region in series irrespective of a sequence.

3. The 4-color pixel image sensor of claim 1, wherein the first metal layer is formed over the plurality of photodiodes in the active pixel region.

4. The 4-color pixel image sensor of claim wherein the plurality of color filters in the active pixel region and in the visible optical black pixel region include a blue color filter, a green color filter and a red color filter.

5. The 4-color pixel image sensor of claim 1, wherein the plurality of first metal layers and the second metal layer are made of aluminum or copper.

6. The 4-color pixel image sensor of claim 1, wherein the first NIR pixel and the second NIR pixel absorbs a light of a whole infrared ray (IR) wavelength band among an incident light.

7. The 4-color pixel image sensor of claim 1, wherein the second metal layer is formed over an entire upper surface of the photodiodes in the visible optical black pixel region.

8. The 4-color pixel image sensor of claim 1, further comprising:
    a control unit suitable for comparing a reference signal outputted from the NIR optical black pixel region to an IR pixel signal including a noise of an active pixel outputted from the active pixel array region, calculating a difference value between the reference signal and the IR pixel signal, and compensating to remove the noise, which is received in the first NIR pixel based on a calculated difference value.

9. The 4-color pixel image sensor of claim 1, wherein the first NIR pixel and the second NIR pixel in the active pixel region and the visual optical black pixel region comprise black photoresists.

10. The 4-color pixel image sensor of claim 1, wherein the first NIR pixel and the second NIR pixel have a structure where two color filters are stacked.

11. A 4-color pixel image sensor having a visible color noise reduction function in a near infrared ray (NIR) pixel, comprising:
    an active pixel region having a plurality of photodiodes, a plurality of first tungsten layers, a plurality of color filters, a first NIR pixel and a micro-lens, which are stacked, wherein the plurality of photodiodes are arranged in series and the plurality of color filters are arranged in series;
    an NIR optical black pixel region having a plurality of photodiodes a second tungsten layer and a second NIR pixel, which are stacked, wherein the plurality of photodiodes are arranged in series; and
    a visible optical black pixel region having a plurality of photodiodes, a third metal layer, a third tungsten layer, a plurality of color filters and a micro-lens, which are stacked, wherein the plurality of photodiodes are arranged in series, and the plurality of color filters are arranged in series,
    wherein the active pixel region, the NIR optical black pixel region and the visible optical black pixel region are arranged on a same substrate in series.

12. The 4-color pixel image sensor of claim 11, wherein the NIR optical black pixel region and the visible optical black pixel region are arranged on a side among four sides of the active pixel array region in series irrespective of a sequence.

13. The 4-color pixel image sensor of claim 11, wherein the third metal layer is made of aluminum or copper.

14. The 4-color pixel image sensor of claim 11, wherein the plurality of color filters in the active pixel region and in the visible optical black pixel region include a blue color filter, a green color filter and a red color filter.

15. The 4-color pixel image sensor of claim 11, wherein the first NIR pixel and the second NIR pixel in the active pixel region and the visual optical black pixel region comprise black photoresists.

16. The 4-color pixel image sensor of claim 11, wherein the first NIR pixel and the second NIR pixel have a structure where two color filters are stacked.

17. The 4-color pixel image sensor of claim 16, wherein the two color filters are a blue color filter and a red color filter.

* * * * *